United States Patent
Letts et al.

(10) Patent No.: US 8,728,234 B2
(45) Date of Patent: May 20, 2014

(54) METHODS FOR PRODUCING IMPROVED CRYSTALLINITY GROUP III-NITRIDE CRYSTALS FROM INITIAL GROUP III-NITRIDE SEED BY AMMONOTHERMAL GROWTH

(75) Inventors: Edward Letts, Buellton, CA (US); Tadao Hashimoto, Santa Barbara, CA (US); Masanori Ikari, Santa Barbara, CA (US)

(73) Assignee: Sixpoint Materials, Inc., Buellton, CA (US)

( * ) Notice: Subject to any disclaimer, the term of this patent is extended or adjusted under 35 U.S.C. 154(b) by 868 days.

(21) Appl. No.: 12/455,760

(22) Filed: Jun. 4, 2009

(65) Prior Publication Data
US 2009/0309105 A1 Dec. 17, 2009

Related U.S. Application Data

(60) Provisional application No. 61/058,900, filed on Jun. 4, 2008.

(51) Int. Cl.
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |

(52) U.S. Cl.
USPC ............ 117/35; 257/E21.09; 257/E29.089; 257/76; 438/478

(58) Field of Classification Search
None
See application file for complete search history.

(56) References Cited

U.S. PATENT DOCUMENTS 2,962,838 A * 12/1960 Kebler et al. .............. 117/12
5,942,148 A 8/1999 Preston
(Continued)

FOREIGN PATENT DOCUMENTS

| EP | 0827192 | 4/1998 |
| EP | 1041610 A1 | 4/2000 |

(Continued)

OTHER PUBLICATIONS

Dwilinski et al., "Excellent Crystallinity of Truly Bulk Ammonothermal GaN", Source: Congres International Workshop on Bulk Nitride Semiconductors V (WBNS5), Island of Itaparica, Salvador, Bahia, BRESIL (Sep. 24, 2007), Journal of Crystal Growth, vol. 310, n. 17, pp. 3911-3916 (Jun. 18, 2008).*

(Continued)

Primary Examiner — Kaj K Olsen
Assistant Examiner — Ross J Christie
(74) Attorney, Agent, or Firm — K&L Gates LLP

(57) ABSTRACT

The present invention discloses methods to create higher quality group III-nitride wafers that then generate improvements in the crystalline properties of ingots produced by ammonothermal growth from an initial defective seed. By obtaining future seeds from carefully chosen regions of an ingot produced on a bowed seed crystal, future ingot crystalline properties can be improved. Specifically, the future seeds are optimized if chosen from an area of relieved stress on a cracked ingot or from a carefully chosen N-polar compressed area. When the seeds are sliced out, miscut of 3-10° helps to improve structural quality of successive growth. Additionally a method is proposed to improve crystal quality by using the ammonothermal method to produce a series of ingots, each using a specifically oriented seed from the previous ingot. When employed, these methods enhance the quality of Group III nitride wafers and thus improve the efficiency of any subsequent device.

9 Claims, 4 Drawing Sheets

(56) References Cited

U.S. PATENT DOCUMENTS

| | | | |
|---|---|---|---|
| 6,117,213 A | 9/2000 | Ueda et al. | |
| 6,156,581 A | 12/2000 | Vaudo et al. | |
| 6,177,057 B1 | 1/2001 | Purdy | |
| 6,177,059 B1 | 1/2001 | Matsuda et al. | |
| 6,316,785 B1 | 11/2001 | Nunoue et al. | |
| 6,326,313 B1 | 12/2001 | Couteau et al. | |
| 6,398,867 B1 | 6/2002 | D'Evelyn et al. | |
| 6,406,540 B1 | 6/2002 | Harris | |
| 6,441,393 B2 | 8/2002 | Goetz et al. | |
| 6,569,238 B2 | 5/2003 | Ishida | |
| 6,596,079 B1 | 7/2003 | Vaudo et al. | |
| 6,656,615 B2 | 12/2003 | Dwilinski et al. | |
| 7,017,514 B1 | 3/2006 | Shepherd et al. | |
| 7,033,439 B2 | 4/2006 | Shibata et al. | |
| 7,078,731 B2 | 7/2006 | D'Evelyn et al. | |
| 7,132,730 B2 | 11/2006 | Dwilinski et al. | |
| 7,160,388 B2 | 1/2007 | Dwilinski et al. | |
| 7,169,227 B2 | 1/2007 | Maruska et al. | |
| 7,170,095 B2 | 1/2007 | Vaudo et al. | |
| 7,303,632 B2 | 12/2007 | Negley | |
| 7,368,015 B2 | 5/2008 | D'Evelyn et al. | |
| 7,589,000 B2 | 9/2009 | Kasai et al. | |
| 7,749,325 B2 | 7/2010 | Nakayama | |
| 7,847,313 B2 | 12/2010 | Shibata | |
| 8,092,597 B2 | 1/2012 | Dmitriev et al. | |
| 8,236,267 B2 | 8/2012 | Hashimoto et al. | |
| 8,337,798 B2 | 12/2012 | Sarayama et al. | |
| 8,357,243 B2 | 1/2013 | Hashimoto et al. | |
| 8,420,041 B2 | 4/2013 | Hashimoto et al. | |
| 2002/0078881 A1 | 6/2002 | Cuomo et al. | |
| 2002/0144645 A1 | 10/2002 | Kim et al. | |
| 2002/0177312 A1 | 11/2002 | Tsvetkov et al. | |
| 2002/0192507 A1 | 12/2002 | Dwilinski et al. | |
| 2003/0024475 A1 | 2/2003 | Anderson | |
| 2004/0051105 A1 | 3/2004 | Tsuda et al. | |
| 2004/0072383 A1 | 4/2004 | Nagahama et al. | |
| 2004/0124434 A1 | 7/2004 | D'Evelyn et al. | |
| 2004/0226588 A1 | 11/2004 | Onishi et al. | |
| 2004/0245535 A1 | 12/2004 | D'Evelyn et al. | |
| 2004/0261692 A1 | 12/2004 | Dwilinski et al. | |
| 2004/0262630 A1 | 12/2004 | Kitaoka et al. | |
| 2005/0053513 A1 | 3/2005 | Pike, Jr. | |
| 2005/0059229 A1* | 3/2005 | Minemoto et al. | 438/602 |
| 2005/0098095 A1 | 5/2005 | D'Evelyn et al. | |
| 2005/0121688 A1 | 6/2005 | Nagai et al. | |
| 2005/0126471 A1 | 6/2005 | Jenny et al. | |
| 2005/0142391 A1 | 6/2005 | Dmitriev et al. | |
| 2005/0161697 A1 | 7/2005 | Nakahata et al. | |
| 2005/0166835 A1 | 8/2005 | Koukitsu et al. | |
| 2005/0224783 A1 | 10/2005 | Matsuyama et al. | |
| 2005/0258451 A1 | 11/2005 | Saxler et al. | |
| 2006/0037530 A1 | 2/2006 | Dwilinski et al. | |
| 2006/0054076 A1 | 3/2006 | Dwilinski et al. | |
| 2006/0057749 A1 | 3/2006 | Dwilinski et al. | |
| 2006/0118799 A1 | 6/2006 | D'Evelyn et al. | |
| 2006/0191472 A1 | 8/2006 | Dwilinski et al. | |
| 2006/0210800 A1 | 9/2006 | Spitsberg et al. | |
| 2006/0213430 A1* | 9/2006 | Jenny et al. | 117/109 |
| 2006/0255341 A1 | 11/2006 | Pinnington et al. | |
| 2006/0280668 A1* | 12/2006 | Dmitriev et al. | 423/412 |
| 2006/0282229 A1 | 12/2006 | Kim et al. | |
| 2007/0012242 A1 | 1/2007 | Jurisch et al. | |
| 2007/0032046 A1 | 2/2007 | Dmitriev et al. | |
| 2007/0084399 A1 | 4/2007 | Sarayama et al. | |
| 2007/0157876 A1 | 7/2007 | Minemoto et al. | |
| 2007/0158785 A1 | 7/2007 | D'Evelyn et al. | |
| 2007/0181056 A1 | 8/2007 | D'Evelyn et al. | |
| 2007/0218703 A1* | 9/2007 | Kaeding et al. | 438/775 |
| 2007/0234946 A1 | 10/2007 | Hashimoto et al. | |
| 2007/0240630 A1* | 10/2007 | Leonard et al. | 117/84 |
| 2007/0252164 A1* | 11/2007 | Zhong et al. | 257/98 |
| 2007/0290230 A1 | 12/2007 | Kawaguchi et al. | |
| 2008/0001165 A1 | 1/2008 | Hashimoto et al. | |
| 2008/0006844 A1 | 1/2008 | D'Evelyn et al. | |
| 2008/0008855 A1 | 1/2008 | D'Evelyn et al. | |
| 2008/0102016 A1 | 5/2008 | Hashimoto et al. | |
| 2008/0111144 A1 | 5/2008 | Fichtenbaum et al. | |
| 2008/0118733 A1 | 5/2008 | Oshima | |
| 2009/0309105 A1 | 12/2009 | Letts et al. | |
| 2010/0213576 A1 | 8/2010 | Hiranaka et al. | |
| 2010/0285657 A1 | 11/2010 | Hashimoto et al. | |
| 2013/0119399 A1 | 5/2013 | Hashimoto et al. | |
| 2013/0135005 A1 | 5/2013 | Hashimoto et al. | |
| 2013/0206057 A1 | 8/2013 | Hashimoto et al. | |

FOREIGN PATENT DOCUMENTS

| | | |
|---|---|---|
| EP | 1 110 600 A2 | 6/2001 |
| EP | 1 818 429 A2 | 8/2007 |
| JP | 50/109896 | 8/1975 |
| JP | 10-125753 | 5/1998 |
| JP | 2001/102307 | 4/2001 |
| JP | 2002/261014 A | 9/2002 |
| JP | 2004-002152 | 4/2004 |
| JP | 2004-002152 | 8/2004 |
| JP | 2004-284876 | 10/2004 |
| JP | 2005-008444 JP | 1/2005 |
| JP | 2005-288350 | 10/2005 |
| JP | 2006/069827 | 3/2006 |
| JP | 2006-509708 | 3/2006 |
| JP | 2006/193355 | 7/2006 |
| JP | 2007/238346 | 9/2007 |
| JP | 2007/238347 | 9/2007 |
| JP | 2007-290921 | 11/2007 |
| JP | 2008/501600 | 1/2008 |
| JP | 2008 127252 | 6/2008 |
| JP | 2007/262815 | 4/2009 |
| JP | 2013-126945 | 6/2013 |
| WO | WO 99/23693 | 5/1999 |
| WO | WO 03-035945 A2 | 5/2003 |
| WO | WO 2004-003261 A1 | 1/2004 |
| WO | WO 2004/053206 | 6/2004 |
| WO | WO 2004-061923 A1 | 7/2004 |
| WO | WO 2006-057463 A1 | 6/2006 |
| WO | WO 2006-080959 A1 | 8/2006 |
| WO | WO 2007-008198 A1 | 1/2007 |
| WO | WO 2007-078844 A2 | 7/2007 |
| WO | WO 2007-117689 A2 | 10/2007 |
| WO | WO 2007-133512 A2 | 11/2007 |
| WO | WO 2007-149487 A2 | 12/2007 |
| WO | WO 2008-051589 A2 | 5/2008 |
| WO | WO 2008/064109 A2 | 5/2008 |
| WO | WO 2009/047894 | 4/2009 |

OTHER PUBLICATIONS

Jacobson, Loren A., "Crystal Symmetries", METE 327: Physical Metallurgy, Department of Materials and Metallurgical Engineering, New Mexico Institute of Mining and Technology (May 16, 2008).*
PCT/US2009/035140, WO International Search Report dated May 29, 2009, pp. 4.
PCT/US2009/035140, WO Written Opinion dated May 29, 2009, pp. 6.
PCT/US2009/035140, WO International Preliminary Report on Patentability dated Mar. 17, 2010, pp. 8.
PCT/US2009/046316, WO International Search Report and Written Opinion dated Oct. 22, 2009, pp. 18.
PCT/US2009/061022, WO International Search Report and Written Opinion dated Jan. 21, 2010, pp. 10.
PCT/US2009/003557, WO International Search Report dated Oct. 26, 2009 pp. 4.
PCT/US2009/046317, WO International Search Report and Written Opinion, dated Sep. 25, 2009 pp. 15.
PCT/US2009/065513, WO International Search Report and Written Opinion, dated Feb. 3, 2010; pp. 15.
Aoki, M., et al., "GaN single crystal growth using high-purity Na as a flux," Journal of Crystal Growth, 2002, pp. 70-76; 242; Elsevier, www.elsevier.com/locate/jcrysgro.
Bliss, D. F., et al., "Aluminum nitride substrate growth by halide vapor transport epitaxy," Journal of Crystal Growth, 2003, pp. 1-6, vol. 250; Elsevier, www.elsevier.com/locate/jcrysgro.

(56) References Cited

OTHER PUBLICATIONS

Callahan, Michael J., et al "Growth of GaN crystals under ammonothermal conditions," Material Research Society, vol. 798, 2004, pp. YS.10.1-Y2.10.6.
Callahan, M., et al., "Gan single crystals grown on HVPE seeds in alkaline supercritical ammonia," J Mater Sci, 2006, pp. 1399-1407, 41.
Chen, Q. S., et al., "Modeling of ammonothermal growth of nitrides," Journal of Crystal Growth, 2003, pp. 181-187, 258; Elsevier, www.elsevier.com/locate/jcrysgro.
Dwilinski, R., et al., "Ammono method of BN, AlN, and GaN synthesis and crystal growth," MRS Internet Journal of Nitride Semiconductor Research, 1998, pp. 1-4; 3, 25.
Dwilinski, R., et al., Ammono method of GaN and AlN production, Diamond and Related Materials, 1998, pp. 1348-1350, 7; Elsevier.
Dwilinski, R., et al., "On GaN Crystallization by Ammonothermal Method," Acta Physica Polonica A, 1996, pp. 763-766, No. 4, vol. 90.
Dwilinski, R., et al., "Excellent crystallinity of truly bulk ammonothermal GaN," Journal of Crystal Growth, 2008, pp. 3911-3916, 310; Elsevier, www.elsevier.com/locate/jcrysgro.
Etzkorn, E. V., et al. "Cracking of GaN Films" Journal of Applied Physics, Jan. 15, 2001, pp. 1025-1034, vol. 89, No. 2, XP001011762, American Institute of Physics.
Hashimoto, Tadao et al. "A GaN bulk crystal with improved structural quality grown by the ammonothermal method," Published online: Jul. 2007; Nature Materials Advance Online Publication www.nature.com/naturematerials; pp. 1-3.
Hashimoto, Tadao et al. "Ammonothermal growth of GaN utilizing negative temperature dependence of solubility in basic ammonia" Mater. Res. Soc. Symp. Proc., 2005, pp. E2.8.1.-E.2.8.6., vol. 831, Materials Research Society.
Hashimoto, Tadao et al. "Growth of Bulk GaN Crystals by the Basic Ammonothermal Method," Japanese Journal of Applied Physics, 2007, pp. L889-L891, vol. 46, No. 37, The Japanese Society of Applied Physics, JJAP Express Letter.
Hashimoto, Tadao et al. "Growth of bulk GaN with Low Dislocation Density by the Ammonothermal Method Using Polycrystalline GaN Nutrient" Japanese Journal of Applied Physics, 2007, pp. L525-L527, vol. 46, No. 22, The Japanese Society of Applied Physics, JJAP Express Letter.
Hashimoto, Tadao et al. "Growth of gallium nitride via fluid transport in supercritical ammonia," Journal of Crystal Growth, 2005, pp. e525-e530; 275, Elsevier, www.elsevier.com/locate/jcrysgro.
Hashimoto, Tadao et al. "Phase selection of microcrystalline GaN synthesized in supercritical ammonia" Journal of Crystal Growth, 2006, pp. 100-106; 291, Elsevier, www.elsevier.com/locate/jcrysgro.
Hashimoto, Tadao et al. "Seeded growth of GaN by the basic ammonothermal method" Journal of Crystal Growth, 2007, pp. 311-316; 305, Elsevier, www.elsevier.com/locate/jcrysgco.
Hashimoto, Tadao et al. "Status and perspectives of the ammonothermal growth of GaN substrates" Journal of Crystal Growth, 2008, pp. 876-880; 310, Elsevier, www.elsevier.com/locate/jcrysgro.
Hashimoto, Tadao et al. "Structural Characterization of Thick GaN Films Grown of Free-Standing GaN Seeds by the Ammonothermal Method Using Basic Ammonia," Japanese Journal of Applied Physics, 2005, pp. L 797-L 799, vol. 44, No. 25, The Japan Society of Applied Physics, JJAP Express Letter.
Hashimoto, Tadao et al., "Ammonothermal growth of GaN on an over-1-inch Seed Crystal," Japanese Journal of Applied Physics, 2005, pp. L 1570-L 1572, vol. 44, No. 52, The Japan Society of Applied Physics, JJAP Express Letter.
Inoue, T., et al., "Pressure-Controlled Solution Growth of Bulk GaN Crystals under High Pressure," 2001, pp. 15-27; 223, 15, Phys. Stat. Sol. (b).
Iwahashi, et al., "Effects of ammonia gas on threshold pressure and seed growth for bulk GaN single crystals by Na flux method," Journal of Crystal Growth, 2003, pp. 1-5, 253; Elsevier, www.elsevier.com/locate/jcrysgro.

Ketchum, Douglas R., et al. "Crystal growth of gallium nitride in supercritical ammonia," Journal of Crystal Growth, 2001, pp. 431-434, 222; Elsevier, www.elsevier.nl/locate/jcrysgro.
Kumagai, Y., et al., "Growth of thick AlN layers by hydride vapor phase epitaxy," Journal Crystal Growth, 2005, pp. 62-67, vol. 281; Elsevier, www.elsevier.com/locate/jcrysgro.
Kumagai, Y., et al., "Hydride vapor phase epitaxy of AlN: thermodynamic analysis of aluminum source and its application to growth," Phys. Stat. Sol. ( c), 2003, pp. 2498-2501, vol. 0, No. 7.
Ledyaev, O., et al., Properties of AlN Layers Grown on SiC Substrates in Wide Temperature Range by HVPE, Phys. Stat. Sol. ( c) ,2002, pp. 474-478, No. 1.
Ohshima, E ., et al. , "Growth of the 2-in-size bulk ZnO single crystals by the hydrothermal method," Journal of Crystal Growth, 2004, pp. 166-170, 260; Elsevier, www.elsevier.com/locate/jcrysgro.
Peters, D. et al., "Ammonothermal Synthesis of Aluminum Nitride," Journal of Crystal Growth, 1990, pp. 411-418, 104.
Porowski. S., "Near Defect Free GaN Substrates," MRS Internet Journal of Nitride Semiconductors, Res. 4S1, 1999, G1.3.
Purdy, A. P., et al "Ammonothermal Recrystallization of Gallium Nitride with Acidic Mineralizers," Cyst. Growth Design, 2002, pp. 141-145, vol. 2, No. 2.
Ramachandran, V. et al., "Inversion of wurtzite GaN(0001) by exposure to magnesium," Applied Physics Letters, Aug. 9, 1999, pp. 808-810, vol. 75, No. 6.
Wu, H. et al., "Rapid Synthesis of High Purity GaN Powder," Phys. Stat. Sol. (c), 2005, pp. 2074-2078, New York.
Yamane, Y. , et al., "Growth of thick AlN layer on sapphire (0001) substrate using hydride vapor phase epitaxy," Phys. Stat. Sol. ( c), 2005, pp. 2062-2065, vol. 2, No. 7.
U.S. Appl. No. 12/392,960 Amendment filed Dec. 21, 2012.
U.S. Appl. No. 12/392,960 Office Action dated Dec. 13, 2011.
U.S. Appl. No. 12/392,960 Amendment filed Mar. 13, 2012.
U.S. Appl. No. 12/392,960 Office Action dated Aug. 24, 2012.
U.S. Appl. No. 12/455,683 Office Action dated Apr. 26, 2011.
U.S. Appl. No. 12/455,683 Amendment filed Feb. 13, 2012.
U.S. Appl. No. 12/455,683 Amendment filed Jul. 26, 2011.
U.S. Appl. No. 12/455,683 Notice of Allowance dated Mar. 15, 2012.
U.S. Appl. No. 12/455,683 Office Action dated Oct. 13, 2011.
U.S. Appl. No. 12/456,181 Amendment filed Sep. 26, 2012.
U.S. Appl. No. 12/456,181 Notice of Allowance dated Oct. 29, 2012.
U.S. Appl. No. 12/456,181 Office Action dated Sep. 4, 2012.
U.S. Appl. No. 12/580,849 Office Action dated Mar. 1, 2013.
U.S. Appl. No. 12/624,006 Office Action dated Feb. 28, 2013.
U.S. Appl. No. 13/491,392 Notice of Allowance dated Dec. 3, 2012.
EP09762938.0 Amendment dated Oct. 9, 2012.
EP09762938.0 Office Action dated May 30, 2012.
JP2010188934 Amendment (Japanese and English translation) dated Mar. 7, 2013.
JP2010188934 Office Action (Japanese and English translation) dated Sep. 4, 2012.
JP2010188935 Amendment (Japanese and English translation) dated Mar. 7, 2013.
JP2010188935 Office Action (Japanese and English translation) dated Sep. 4, 2012.
JP2010188936 Amendment (Japanese and English translation) dated Mar. 7, 2013.
JP2010188936 Office Action (Japanese and English translation) dated Sep. 4, 2012.
JP2010540956 JP and English translation, Amendment dated Feb. 18, 2013.
JP2010540956 Office Action dated Aug. 14, 2012.
JP2010540958 Amendment filed Dec. 21, 2012.
JP2010540958 Office Action, Japanese with English translation, Jan. 21, 2013.
JP2010548751 (Japanese and English translation) Amendment dated Jan. 7, 2013.
JP2010548751 (Japanese and English translation) Office Action dated Sep. 4, 2012.
JP2010548951 Office Action (Japanese and English translation) dated Sep. 4, 2012.
PCT/US09/046316 International Preliminary Report on Patentability dated Dec. 6, 2010 and Written Opinion, pp. 13.

(56) References Cited

OTHER PUBLICATIONS

PCT/US09/061022 International Preliminary Report on Patentability dated Apr. 19, 2011 and Written Opinion, pp. 6.
PCT/US2009/003557, International Preliminary Report on Patentability dated Dec. 14, 2010 and Written Opinion, pp. 8.
PCT/US2009/046317 International Preliminary Report on Patentability dated Dec. 6, 2010 and Written Opinion, pp. 9.
PCT/US2009/065513 International Preliminary Report on Patentability dated May 24, 2011 and Written Opinion, pp. 8.
PCT/US2010/033790 (Sixpoi-008W0) International Search Report, dated Oct. 26, 2010, pp. 6.
Schineller, B., et al. "Vertical-HVPE as a Production Method for Free-Standing GaN-Substrates", CS Mantech Conference, May 14-17, 2007 Austin TX [USA]; [Online] 07A, May 14, 2007, pp. 123-126, XP002592188; URL:http://www.gaasmantech.org/Digests/2007/2007%20Papers/07a.pdf.
JP2010548951 Amendment (Japanese and English translation) dated Mar. 7, 2013.
U.S. Appl. No. 12/392,960 Office Action dated Apr. 9, 2013.
JP2010540956 Japanese, Notice of Allowance dated Mar. 18, 2013.
U.S. Appl. No. 12/392,960 Office Action Oct. 25, 2013.
U.S. Appl. No. 12/624,006 Amendment dated Nov. 8, 2013.
U.S. Appl. No. 12/392,960 Amendment Jun. 18, 2013.
U.S. Appl. No. 12/580,849 Amendment dated Jun. 3, 2013.
U.S. Appl. No. 12/624,006 Amendment dated May 28, 2013.
U.S. Appl. No. 12/624,006 Office Action dated Aug. 9, 2013.
U.S. Appl. No. 12/174,677 Office Action dated Sep. 27, 2013.
U.S. Appl. No. 13/728,769 Notice of Allowance dated Sep. 13, 2013.
U.S. Appl. No. 13/728,769 Office Action dated May 23, 2013.
U.S. Appl. No. 13/728,769 Terminal Disclaimer and Amendment dated Aug. 13, 2013.
U.S. Appl. No. 13/728,799 Notice of Allowance dated Aug. 15, 2013.
EP09759458.4 Amendment dated Apr. 30, 2013.
JP2010188934 Amendment (Japanese and English translation) dated Aug. 13, 2013.
JP2010188934 Office Action (Japanese and English translation) dated May 14, 2013.
JP2010548751 (Japanese and English translation) Office Action mailed Mar. 15, 2013.
JP2010548951 Amendment (Japanese and English translation) dated Aug. 13, 2013.
JP2010548951 Office Action (Japanese and English translation) dated May 14, 2013.
Wang, Buguo et al., "Ammonothermal Growth of GaN Crystals in Alkaline Solutions" Journal of Crystal Growth, Jan. 2006; pp. 376-380; vol. 287.
Hashimoto, Tadao et al., "Ammonothermal growth of bulk GaN," Journal of Crystal Growth, Jun. 7, 2008, pp. 3907-3910; vol. 310.

* cited by examiner

METHODS FOR PRODUCING IMPROVED CRYSTALLINITY GROUP III-NITRIDE CRYSTALS FROM INITIAL GROUP III-NITRIDE SEED BY AMMONOTHERMAL GROWTH

CROSS REFERENCE TO RELATED APPLICATIONS

This application claims the benefit of priority to U.S. App. Ser. No. 61/058,900, filed Jun. 4, 2009, entitled "Methods For Producing Improved Crystallinity Group III-Nitride Crystals From Initial Group III-Nitride Seed By Ammonothermal Growth", inventors Edward Letts, Tadao Hashimoto, and Masanori Ikari, the entire contents of which are incorporated by reference herein as if put forth in full below. This application is also related to PCT application serial number PCT/US2009/046316 entitled "Methods For Producing Improved Crystallinity Group III-Nitride Crystals From Initial Group III-Nitride Seed By Ammonothermal Growth", inventors Edward Letts, Tadao Hashimoto, and Masanori Ikari, filed on Jun. 4, 2009, the entire contents of which are incorporated by reference herein as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS";

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD";

U. S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY".

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS".

which applications are incorporated by reference herein.

BACKGROUND

1. Field of the Invention

The invention is related to the production method of group III-nitride wafers using the ammonothermal method combined with cutting and processing of an ingot to improve the crystal quality from an initial group III-nitride seed.

2. Description of the Existing Technology (Note: This patent application refers to several publications and patents as indicated with numbers within brackets, e.g., [x]. A list of these publications and patents can be found in the section entitled "References.")

Gallium nitride (GaN) and its related group III alloys are the key material for various opto-electronic and electronic devices such as light emitting diodes (LEDs), laser diodes (LDs), microwave power transistors, and solar-blind photo detectors. Currently LEDs are widely used in cell phones, indicators, displays, and LDs are used in data storage disc drives. However, the majority of these devices are grown epitaxially on heterogeneous substrates, such as sapphire and silicon carbide. The heteroepitaxial growth of group III-nitride causes highly defected or even cracked films, which hinders the realization of high-end optical and electronic devices, such as high-brightness LEDs for general lighting or high-power microwave transistors.

Most of the problems inherent in heteroepitaxial growth could be avoided by instead using homoepitaxial growth with single crystalline group III-nitride wafers sliced from bulk group III-nitride crystal ingots for homoepitaxy. For the majority of devices, single crystalline GaN wafers are favored because it is relatively easy to control the conductivity of the wafer and GaN wafers will provide the smallest lattice/thermal mismatch with device layers. Currently, however, the GaN wafers needed for homogeneous growth are extremely expensive compared to heteroeptiaxial substrates. This is because it has been difficult to grow group III-nitride crystal ingots due to their high melting point and high nitrogen vapor pressure at high temperature. Growth methods using molten Ga, such as high-pressure high-temperature synthesis [1,2] and sodium flux [3,4], have been proposed to grow GaN crystals. Nevertheless the crystal shape grown using molten Ga is a thin platelet because molten Ga has low solubility of nitrogen and a low diffusion coefficient of nitrogen.

An ammonothermal method, which is a solution growth method using high-pressure ammonia as a solvent, has been used to achieve successful growth of real bulk GaN ingots [5]. Ammonothermal growth has the potential for growing large GaN crystal ingots because high-pressure ammonia has advantages as a fluid medium including high solubility of source materials, such as GaN polycrystals or metallic Ga, and high transport speed of dissolved precursors.

Currently, state-of-the-art ammonothermal method [6-8] relies on seed crystals to produce large ingots. A lack of large seed crystals free of strains and defects limits the growth of high quality bulk GaN ingots with a diameter of 3" or greater. Several potential seeds produced by different methods exist; however the seeds tend to be either small or defective. For instance, 2" free standing GaN wafers have been produced by the Hydride Vapor Phase Epitaxy (HVPE) on sapphire or SiC substrates. Due to the large lattice mismatch between GaN and the sapphire or SiC substrates, the resulting GaN growth is bowed, strained and has a large defect density. Continued growth on a free standing seed produced by HVPE typically produces defective growth. In contrast, GaN crystals produced by the high pressure synthesis or sodium flux method tend to have high quality but limited size and availability. A method to improve defective seed crystals would improve the feasibility of producing large ingots suitable for use as substrates for devices.

SUMMARY OF THE INVENTION

To address the problems inherent with growth on the available defective seed, the present invention discloses a new growth scheme including 3 different methods to improve the crystal quality of group III-nitride crystals grown by the ammonothermal method. Due to the lattice mismatch of GaN and typical heteroepitaxial substrates, seed crystals produced by heteroepitaxial methods show concave bowing of c-plane lattice along +c direction with typical curvature radius of 1 m. However, we discovered that subsequent growth of GaN by the ammonothermal method on such seed crystals results in flipping over the bowing direction. Therefore, GaN on the Ga-polar (0001) surface grows under tensile stress while GaN on the N-polar (000-1) surface grows under compression. The compression on the N-polar surface prevents cracking and allows continuous oriented growth. Moreover, one can obtain very flat crystal by choosing appropriate growth thickness before the bowing direction flips. After group III-nitride ingots are grown by the ammonothermal method, the ingots are sliced into wafers whose thickness is between about 0.1 mm and about 2 mm. By cutting from N-polar growth at the optimized position, orientation and miscut so that the cut surface is not along the crystal face but at an angle to the crystal face, the resulting wafer can be used as an improved seed for subsequent growths that will then have limited bowing and reduced stress.

By comparison, growth on the Ga-polar surface tends to crack. Another method to obtain a seed with lower strain and bowing is to harvest a small crack free region on the Ga-polar (0001) face of an initial ingot in which cracking occurred. Cracking relieves the stress in the surrounding region of growth. By harvesting one of these localized regions of relieved stress as a seed crystal, subsequent ingot growth would produce an improved crystal quality compared to the initial seed crystal.

Lastly, a method is disclosed to produce seed crystal(s) with improved crystal quality from an initial seed crystal and can be achieved by the growth of a series of ingots each produced on a wafer with a specific crystal orientation harvested from the previous ingot.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION OF THE INVENTION

Figure 1:
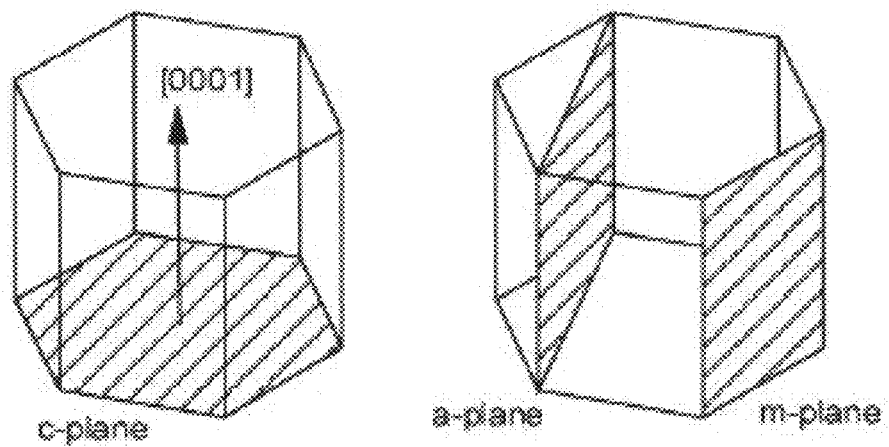
FIG. 1 Primary crystallographic planes of the III: nitride wurtzite crystal lattice. On the left is the historically used c-plane, on the right are the non-polar a-plane and m-plane.

The present invention provides a method of producing group III-nitride wafers, primarily group III-nitride single crystalline wafers that include at least one of the group III elements B, Al, Ga and In, such as GaN, AlN and InN. The group III-nitride ingots are grown by the ammonothermal method which utilizes high-pressure $NH_3$ as a fluid medium, nutrient containing group III elements, and seed crystals that are group III-nitride single crystals. The high-pressure $NH_3$ provides high solubility of the nutrient and high transport speed of dissolved precursors. After the group III-nitride ingots are grown, the ingots are sliced into wafers of thickness between about 0.1 mm and about 2 mm using conventional means such as by mechanically sawing with a wire saw, a dicing saw, or by laser cutting. The III-nitride crystal structure of interest has a wurtzite crystal structure with the important facets c, m, and a-planes shown in FIG. 1.

In one instance, a method for growing group III nitride crystals includes:
  (a) growing group III nitride ingots on original seed crystals by the ammonothermal method;
  (b) slicing wafers out of the ingots;
  (c) using wafers taken from the nitrogen-polar side of the original seed crystals as new seed crystals for subsequent growth of ingots by the ammonothermal method.

The group III nitride may be GaN, for instance.

The original seed crystals may be formed using a heteroepitaxial deposition process if desired.

The method may also include slicing new wafers from the subsequently-grown ingots and using these new wafers as seeds in subsequent ammonothermal growth of new ingots.

The method may therefore be practiced under conditions that provide:
  improvement in the bowing of crystallographic lattice along the slicing direction as compared to the initial seed crystals;
  strain in the new seed is reduced from the initial seed crystals;
  crystallinity is improved over crystallinity of the initial seed crystals;
  bowing of the crystallographic lattice along the slicing direction is inverted from the initial seed crystal;
  bowing of crystallographic lattice along the slicing direction is improved over the initial seed crystals;
  strain in the new seed is reduced from the initial seed crystals; and/or
  crystallinity is improved from the initial seed crystals.

In any of the instances above, wafers may be sliced from the ingot in a plane misoriented from c plane of the grown crystals by 3 to 15 degrees.

The slice may be formed to provide:

bowing of crystallographic lattice along the slicing direction is improved from the initial seed crystals;

strain in the new seed is reduced from the initial seed crystals; and/or crystallinity is improved from the initial seed crystals.

An additional method for growing group III nitride crystals involves:

(a) growing group III-nitride ingots on original seed crystals by the ammonothermal method until some cracking occurs;

(b) separating a crack free region out of the ingots; and (c) using the separated region as a new seed for subsequent growth of an ingot.

The group III nitride may be e.g. GaN.

The original seed crystals may optionally be formed using a heteroepitaxial deposition process for forming group III-nitride crystals such as GaN.

The method may additionally include slicing new wafers from the subsequently-grown ingots and using these new wafers as seeds in a subsequent ammonothermal growth of new ingots.

Any of these methods may be performed under conditions wherein:

the bowing of crystallographic lattice along the slicing direction is improved from the initial seed crystals;

strain in the new seed is reduced from strain in the initial seed crystals; and/or crystallinity is improved over the crystallinity of the initial seed crystals.

Wafers may be sliced from the ingot along a plane misoriented from c plane by 3 to 15 degrees, and optionally the wafers may be used as new seed material in ammonothermal growth of new ingots.

A third method of growing group III-nitride crystals may include:

(a) growing ingots on c-facets of seed crystals by the ammonothermal method to a thickness greater than 5 mm;

(b) slicing the ingots along the a-plane or a semi-polar plane to form seeds;

(c) using the a-plane or semi-polar plane seeds to grow new ingots;

(d) slicing the new ingots along the a-plane or the semi-polar plane; and (e) using a-plane or semi-polar plane wafers not containing any original material of the initial seed crystal to grow additional new ingots.

The method may be practiced using only a-plane slices or only semi-polar plane slices, or the method may be performed by using one slicing direction for one ingot and another slicing direction for a subsequent ingot.

The group III-nitride may be e.g. GaN.

The method in any of these instances may further include slicing an ingot obtained in step (e) above to produce c-plane wafers.

The method may be performed under conditions where:

bowing of crystallographic lattice along the slicing direction is improved from the initial seed crystals;

strain in the new seed is reduced from the initial seed crystals; and/or crystallinity is improved from the initial seed crystals.

GaN wafers may be produced in which the c-plane lattice bows convexly in the +c direction.

These GaN wafers may have a basal plane that is c-plane and miscut within 10 degrees.

The GaN wafers may have a basal plane that is m-plane and miscut within 10 degrees.

The GaN wafers may have a basal plane that is a-plane and miscut within 10 degrees.

The following additional detailed explanation describes detailed procedures to aid in further understanding of the invention.

Method 1

A reaction vessel with an inner diameter of 1 inch was used for the ammonothermal growth. All necessary sources and internal components were loaded together with the reaction vessel into a glove box. In one growth occasion, these components included 10 g of polycrystalline GaN nutrient held in a Ni mesh basket, 0.34 mm-thick single crystalline c-plane GaN seeds, and six baffles to restrict flow. The initial GaN seed was produced by HVPE on sapphire which caused the seed crystal to be bowed and strained. The glove box is filled with nitrogen, and the oxygen and moisture concentration was maintained at less than 1 ppm. Since the mineralizers are reactive with oxygen and moisture, the mineralizers were stored in the glove box all the time. 4 g of as-received $NaNH_2$ was used as a mineralizer. After loading mineralizer into the reaction vessel, six baffles together with seeds and nutrient were loaded. After closing the lid of the reaction vessel, the reaction vessel was taken out of the glove box. Then, the reaction vessel was connected to a gas/vacuum system, which can pump down the vessel as well as can supply $NH_3$ to the vessel. First, the reaction vessel was evacuated with a turbo molecular pump to achieve a pressure of less than $1\times10^{-5}$ mbar. The actual pressure achieved for this example was $1.2\times10^{-6}$ mbar. In this way, residual oxygen and moisture on the inner wall of the reaction vessel were partially removed. After this, the reaction vessel was chilled with liquid nitrogen and $NH_3$ was condensed in the reaction vessel. About 40 g of $NH_3$ was charged in the reaction vessel. After closing the high-pressure valve of the reaction vessel, the reaction vessel was transferred to a two zone furnace. The reaction vessel was heated to 510° C. in the crystallization zone and 550° C. in the dissolution zone for the first 24 hrs before being to adjusted to 575° C. in the crystallization zone and 510° C. in the dissolution zone. After 8 days, ammonia was released and the reaction vessel was opened. The total thickness of the grown GaN ingot was 1.30 mm.

Figure 2:
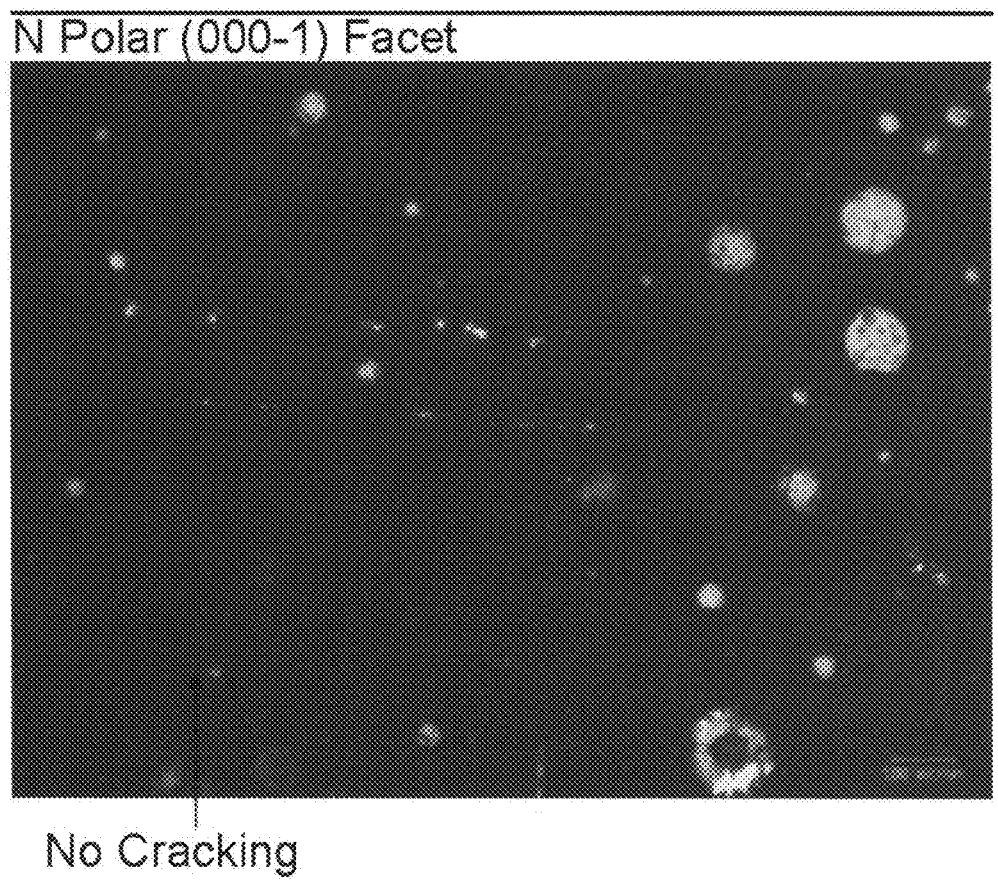
FIG. 2 Photomicrograph of N-polar facet of GaN grown by the ammonothermal method. No cracking was observed after 400 μm of growth on the N-polar facet. The scale bar is equal to 100 μm.

Microscope images of the growth on the Ga-polar surface showed cracking while the N-polar surface showed no cracking and a relatively flat surface, see FIG. 2. Crystal structure measured on the N-polar surface showed a single peak from 002 reflection. The Full Width Half Max (FWHM) of the peak was 209 arcsecs. On the other hand, the Ga-polar surface showed multiple sharp peaks from 002 reflections with FWHM of 2740 arcsec. The multiple sharp peaks from Ga-polar side represent a gathering of high-quality grains. This difference in growth on the different polarities is caused by the bowing of the seed crystal, as diagrammed in FIG. 3. Bowing of the seed crystal causes the growth on the Ga-polar surface to be under tensile strain and prone to cracking while the growth on the N-polar surface is under compressive strain which prevents cracking of the growth.

Figure 3:
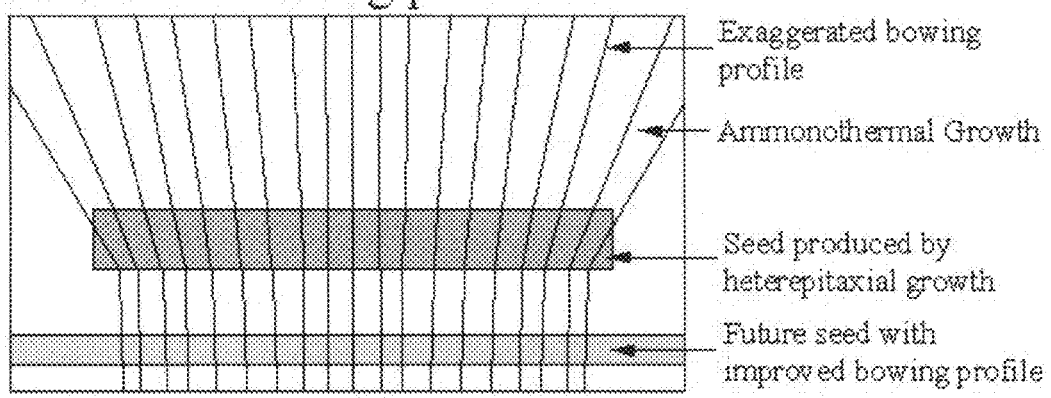
FIG. 3 An exaggerated illustration of the bowing profile on a potential seed crystal and the expected bowing profile of the resulting growth.

The bowing profile was improved in the N-polar growth compared to the initial seed bowing profile, as shown in FIG. 3. In one growth occasion, the radius of lattice bowing on N-polar side was improved to 130 m (convex) from 1.15 m (convex), which was the original radius of lattice bowing of the seed.

By harvesting the N-polar growth as a seed for future ingots, problems associated with bowing may be minimized allowing subsequent crack free growth on the Ga-polar surface as well. In addition, optimization of the growth thickness should yield improved crystallinity for future ingots.

It was also confirmed that using miscut substrates as seed crystals helps to improve crystal quality. In one growth occasion, ammonothermal growth was conducted with two kinds of miscut seeds, one with 7° off from the c-plane and the other with 3° off from the c-plane. The FWHM of X-ray rocking curve from 002 reflection of the original seeds were 605 arcsec and 405 arcsec for 7° off and 3° off, respectively. After growth, the FWHM of X-ray rocking curve became 410 arcsec and 588 arcsec for 7° off and 3° off, respectively. From this result, it was confirmed that miscut as much as approximately 7° helps improve structural quality. Miscut could be up to 10° or 15° off axis rather than up to 3° or up to 70 off axis.

Method 2

Figure 4:
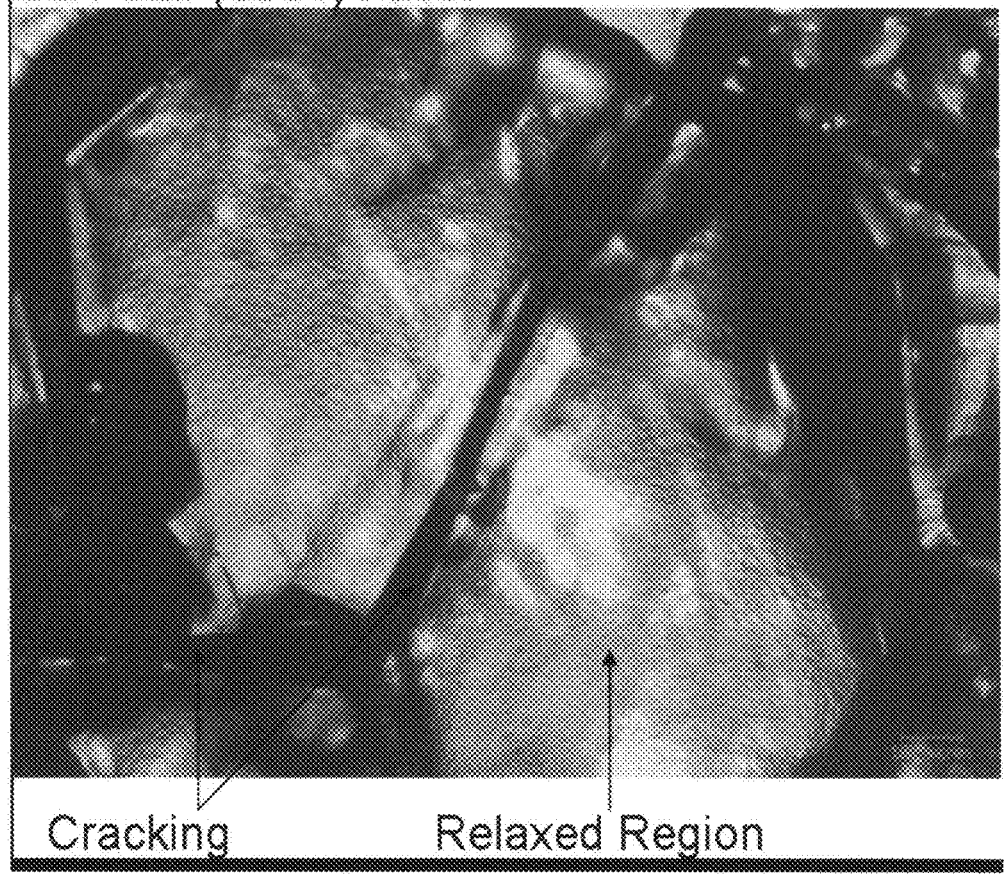
FIG. 4 Photomicroscope of Ga-polar facet of GaN grown by the ammonothermal method. Cracking was observed after 400 μm of growth on the Ga-polar facet. The scale bar is equal to 100 μm.

With similar growth condition as indicated for Method 1, a GaN ingot as thick as 1.3 mm was obtained after 8 day-growth. Microscope images of the growth on the Ga Polar surface showed cracking as shown in FIG. 4. while the N-polar surface showed no cracking and a relatively flat surface. As explained for Method 1, the crystal on Ga-polar side consists of many high-quality grains. Therefore, it is expected that after cracking occurs, harvesting a relaxed region of the growth on the Ga-polar surface as a seed crystal would enable future ingots to exhibit improved crystallinity from the initial seed crystal. Harvested regions are expected to have a Ga-polar surface area between about 0.1 mm$^2$ and about 5.0 mm$_2$.

Method 3

Figure 5:
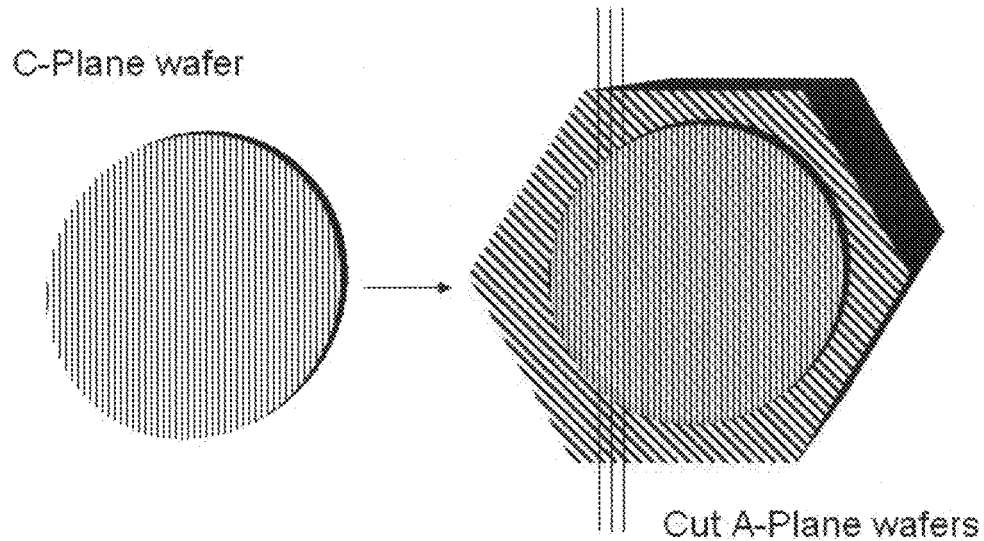
FIG. 5 An illustration of the seed's c-plane growth orientation before (left) and after (right) ammonothermal growth for the first ingot in the series. The lines indicate the direction of the wires to slice orientated wafers out of the ingot.
Figure 6:
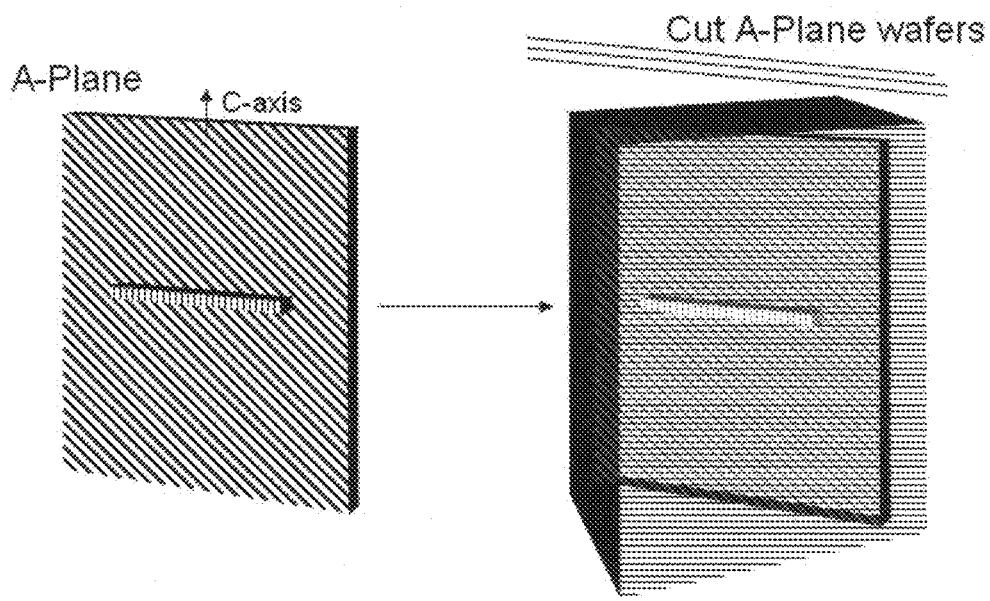
FIG. 6 An illustration of the seed's a-plane growth orientation before (left) and after (right) ammonothermal growth for the second ingot in the series. The lines indicate the direction of the wires to slice orientated wafers out of the ingot.
Figure 7:
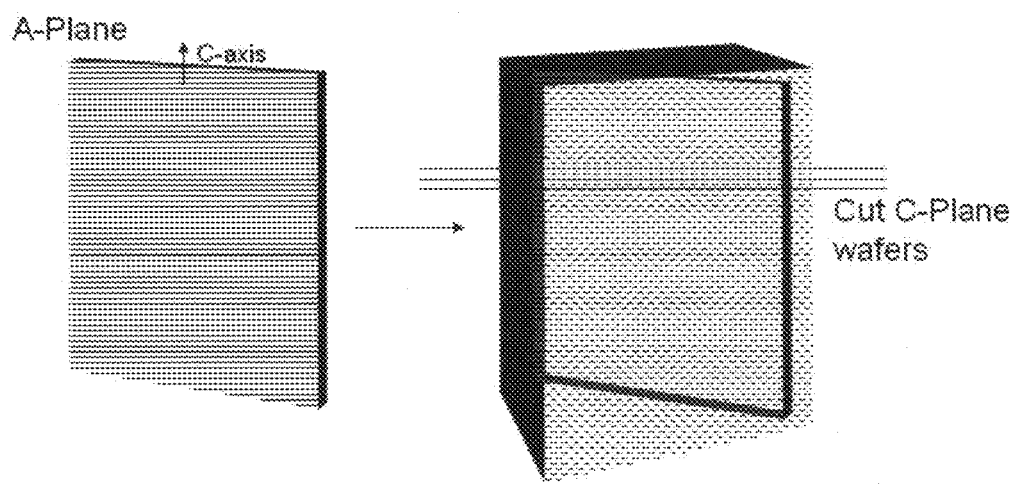
FIG. 7 An illustration of the seed's a-plane growth orientation before (left) and after (right) ammonothermal growth for the third ingot in the series. The lines indicate the direction of the wires to slice orientated wafers out of the ingot.

The ammonothermal growth technique discussed above can be used to produce a series of ingots and by selecting specific regions with a crystallographic orientations for subsequent seeds, the crystallinity of III-nitride material can be improved. Starting with an imperfect c-plane seed crystal, the first ingot primary growth direction is along the c-axis, as shown in FIG. 5. Due to cracking problems the growth on the Ga-polar surface may not be suitable for continued growth. The first ingot is then sliced using a wire saw to produce a-plane wafers. Using an a-plane wafer as a seed, a new ingot is then produced by the ammonothermal growth techniques as shown in FIG. 6. The second ingot is then sliced using a wire saw to produce a-plane wafers. By choosing a wafer which contains no initial seed crystal as the new seed, a third ingot can be produced which contains none of the initial seed crystal, as shown in FIG. 7. This third ingot can then be sliced with a wire saw in any given orientation to produce seed crystals of improved crystallinity.

This method promotes growth by limiting the size and effect of the dislocations, bowing, and strain of the seed. This method realizes bulk crystal growth with very low threading dislocations densities and an improved bowing profile. This method can be modified to use a semipolar or m-plane growth instead of the a-plane orientation.

Advantages and Improvements

The present invention disclosed new production methods of group III-nitride wafers with improved crystal structure. Using several possible strategies, specific regions of a grown ingot may be harvested as a future seed to drastically improve the quality of future ingots compared to the initial seed. Additionally, a method is proposed to produce a series of ingots that could produce an drastic improvement of crystal-line quality. These improvement would improve efficiencies for any optical devices fabricated on the wafers.

REFERENCES

The following references are incorporated by reference herein:

[1]. S. Porowski, MRS Internet Journal of Nitride Semiconductor, Res. 4S1, (1999) G1.3.

[2] T. Inoue, Y. Seki, O. Oda, S. Kurai, Y. Yamada, and T. Taguchi, Phys. Stat. Sol. (b), 223 (2001) p. 15.

[3] M. Aoki, H. Yamane, M. Shimada, S. Sarayama, and F. J. DiSalvo, J. Cryst. Growth 242 (2002) p. 70.

[4] T. Iwahashi, F. Kawamura, M. Morishita, Y. Kai, M. Yoshimura, Y. Mori, and T. Sasaki, J. Cryst Growth 253 (2003) p. 1.

[5] T. Hashimoto, F. Wu, J. S. Speck, S. Nakamura, Jpn. J. Appl. Phys. 46 (2007) L889.

[6] R. Dwiliński, R. Doradziński, J. Garczyński, L. Sierzputowski, Y. Kanbara, U.S. Pat. No. 6,656,615.

[7] K. Fujito, T. Hashimoto, S. Nakamura, International Patent Application No. PCT/US2005/024239, WO07008198.

[8] T. Hashimoto, M. Saito, S. Nakamura, International Patent Application No. PCT/US2007/008743, WO07117689. See US20070234946, U.S. application Ser. No. 11/784,339 filed Apr. 6, 2007.

Each of the references above is incorporated by reference in its entirety as if put forth in full herein, and particularly with respect to description of methods of growth using ammonothermal methods and using gallium nitride substrates.

CONCLUSION

This concludes the description of the preferred embodiment of the invention. The following describes some alternative embodiments for accomplishing the present invention.

Although the preferred embodiment describes the growth of GaN as an example, other group III-nitride crystals may be used in the present invention. The group III-nitride materials may include at least one of the group III elements B, Al, Ga, and In.

In the preferred embodiment specific growth apparatuses and slicing apparatus are presented. However, other constructions or designs that fulfill the conditions described herein will have the same benefit as these examples.

The present invention does not have any limitations on the size of the wafer, so long as the same benefits can be obtained.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for growing group III nitride crystals, comprising:
   (a) growing a first group III nitride ingot on a first seed crystal by an ammonothermal method until a radius of curvature of a c-plane lattice of the group III nitride ingot becomes larger than a radius of curvature of a c-plane lattice of the first seed crystal and until bowing of the c-plane lattice of the first group III nitride ingot along a slicing direction is inverted from a bowing direction of the first seed crystal along the c-plane lattice of the first seed crystal;

(b) slicing one or more wafers out of the first ingot along the slicing direction and from a nitrogen polar side of the ingot;

(c) using the one or more wafers taken from the nitrogen-polar side of the first ingot as a second seed crystal for subsequent growth of one or more second ingots by the ammonothermal method.

2. The method of claim 1, wherein the group III nitride is GaN.

3. The method of claim 1, wherein the bowing of the c-plane lattice along the slicing direction is improved from the bowing of the c-plane lattice of the first seed crystal.

4. The method of claim 1, wherein strain in the second seed crystal is reduced from strain in the first seed crystal.

5. The method of claim 1, wherein crystallinity of the second seed crystal is improved from crystallinity of the first seed crystal.

6. The method of claim 1, wherein the one or more wafers sliced from the first group III nitride ingot are misoriented from a c-plane of the first ingot by 3 to 15 degrees.

7. The method of claim 6, wherein the bowing of crystallographic lattice in the second seed crystal along the slicing direction is improved from the bowing of the first seed crystal.

8. The method of claim 6, wherein strain in the second seed crystal is reduced from strain in the first seed crystal.

9. The method of claim 6, wherein crystallinity of the second seed crystal is improved from crystallinity of the first seed crystal.

* * * * *